United States Patent
Kang et al.

(10) Patent No.: US 7,256,441 B2
(45) Date of Patent: Aug. 14, 2007

(54) PARTIALLY RECESSED DRAM CELL STRUCTURE

(75) Inventors: Woo-Tag Kang, Apex, NC (US); Jungwon Suh, Apex, NC (US)

(73) Assignee: Infineon Technologies AG, Neubiberg (DE)

(*) Notice: Subject to any disclaimer, the term of this patent is extended or adjusted under 35 U.S.C. 154(b) by 158 days.

(21) Appl. No.: 11/100,500

(22) Filed: Apr. 7, 2005

(65) Prior Publication Data
US 2006/0228861 A1  Oct. 12, 2006

(51) Int. Cl.
*H01L 29/76* (2006.01)

(52) U.S. Cl. .................................... 257/301; 257/302

(58) Field of Classification Search ............... 257/301, 257/302
See application file for complete search history.

(56) References Cited

U.S. PATENT DOCUMENTS

| | | | |
|---|---|---|---|
| 6,323,082 B1 | 11/2001 | Furukawa et al. | |
| 6,441,422 B1 | 8/2002 | Mandelman et al. | |
| 6,620,699 B2 | 9/2003 | Scholz et al. | |
| 6,703,274 B1 | 3/2004 | Chidambarrao et al. | |
| 6,784,477 B2* | 8/2004 | Jang | 257/301 |
| 6,797,636 B2 | 9/2004 | Tews et al. | |
| 7,129,129 B2* | 10/2006 | Adam et al. | 438/242 |
| 2002/0089007 A1 | 7/2002 | Divakaruni et al. | |
| 2002/0090780 A1 | 7/2002 | Divakaruni et al. | |
| 2003/0034512 A1 | 2/2003 | Cappelani et al. | |
| 2003/0224605 A1 | 12/2003 | Tews et al. | |
| 2005/0045936 A1* | 3/2005 | Chang et al. | 257/301 |

* cited by examiner

*Primary Examiner*—Thao P. Le
(74) *Attorney, Agent, or Firm*—Edell, Shapiro & Finnan, LLC

(57) ABSTRACT

A dynamic random access memory (DRAM) cell structure (and method for making a DRAM cell structure) that is more suitable than current DRAM structures for implementation in ever decreasing semiconductor fabrication geometries. The DRAM cell structure comprises a deep trench (DT) capacitor formed in a substrate. A recess is formed in the substrate proximate the deep trench capacitor. A gate is formed that extends into the recess but does not completely occupy the recess. A source is formed in the substrate in a region beneath the recess. A drain is formed in the substrate in a region laterally and vertically offset from the source. A channel between the source and drain is created beneath the gate along a side wall of the recess. Thus, the depth of the recess determines the length of the channel region. With this DRAM cell structure, it is easier to avoid the high doping concentration issue and the short channel effect. Consequently, this DRAM cell structure can be employed with smaller fabrication technologies.

22 Claims, 19 Drawing Sheets

PARTIALLY RECESSED DRAM CELL STRUCTURE

FIELD OF THE INVENTION

This invention relates to semiconductor memory devices, their structures and methods for manufacturing the same.

BACKGROUND OF THE INVENTION

In advanced dynamic random access memory (DRAM) technology, an array of cells are formed with field effect transistors (FETs) that exhibit a relatively large "short channel effect" and junction leakage problems due to the dopant diffusion of the source/drain, buried strap, and channel. Generally, to reduce the short channel effect and target threshold voltage (Vt), channel doping concentration is increased. However, the higher doping concentration causes the junction leakage current to increase. There is a significantly large junction leakage issue when the channel doping reaches the maximum allowable doping concentration range (approximately $10^{18}/cm^3$), which is important for refresh of DRAM cells.

In the conventional trench DRAM structure, more doping concentration than the allowable maximum is required because of the diffusion of the buried strap doping below the channel region and source/drain. Therefore, it is very difficult to shrink or scale-down the conventional planar cell structure without solving the high channel doping concentration problem. In fact, conventional DRAM trench cell structure can be only linearly scaled-down without any structural change. This will meet the maximum channel doping range near the buried strap but no further scaling-down is possible because of the large junction leakage due to the junction punch-through-current.

What is needed is a DRAM cell structure and manufacturing process that offers the ability to significantly scale-down the structure as semiconductor manufacturing technologies advance.

SUMMARY OF THE INVENTION

Briefly, a dynamic random access memory (DRAM) cell structure is provided that is more suitable than current DRAM structures for implementation in ever decreasing semiconductor fabrication geometries. The DRAM cell structure comprises a deep trench (DT) capacitor formed in a substrate. A recess is formed in the substrate proximate the deep trench capacitor. A gate is formed that extends into the recess but does not completely occupy the recess. A source is formed in the substrate in a region beneath the recess. A drain is formed in the substrate in a region laterally and vertically offset from the source. A channel between the source and drain is created beneath the gate along a side wall of the recess. Thus, the depth of the recess determines the length of the channel region. With this DRAM cell structure, it is easier to avoid the high doping concentration issue and the short channel effect. Consequently, this DRAM cell structure can be employed with smaller fabrication technologies.

Similarly, a method is provided for fabricating a dynamic random access memory (DRAM) cell structure comprising: forming a deep trench capacitor in a substrate; forming a recess in the substrate proximate the deep trench capacitor; forming a gate extending into the recess; forming silicon oxide along a side wall of the recess beneath a surface of the gate; implanting dopant in the substrate in a region beneath the recess to form a source; and implanting dopant in the substrate in a region laterally and vertically offset from the source to form a drain, whereby a channel between the source and drain is created beneath the gate along the side wall of the recess. Moreover, silicon oxide is formed on a portion of a horizontal surface above the recess connected to the side wall and on a portion of a floor of the recess connected to the side wall.

The objects and advantages of the invention will become more readily apparent when reference is made to the following description taken in conjunction with the accompanying drawings, wherein like reference numerals in the various figures are utilized to designate like components.

BRIEF DESCRIPTION OF THE DRAWINGS

FIG. 2 shows the deep trench formation process.

FIG. 3 shows the deep trench top polysilicon recess process.

FIG. 4 illustrates active area lithography and etching for the shallow trench isolation (STI) process.

FIG. 5 illustrates oxide filling and oxide chemical-mechanical polishing (CMP).

FIG. 6 illustrates nitride and STI oxide removal by wet etching.

FIGS. 7 and 8 illustrate formation of the partial recess.

FIGS. 9-12 illustrate the gate formation process.

FIG. 13 illustrates the sidewall oxidation and dopant implantation process.

FIG. 14 illustrates the spacer nitride deposition process.

FIG. 15 illustrates the spacer etching process.

FIG. 16 illustrates the oxide deposition, oxide CMP, contact formation and metallization process.

FIG. 17 illustrates a cross-section of the partially recessed DRAM structure in both the cell array area and peripheral circuit area, and also shows an optional plug element that improves contact resistance.

DETAILED DESCRIPTION

Figure 1:
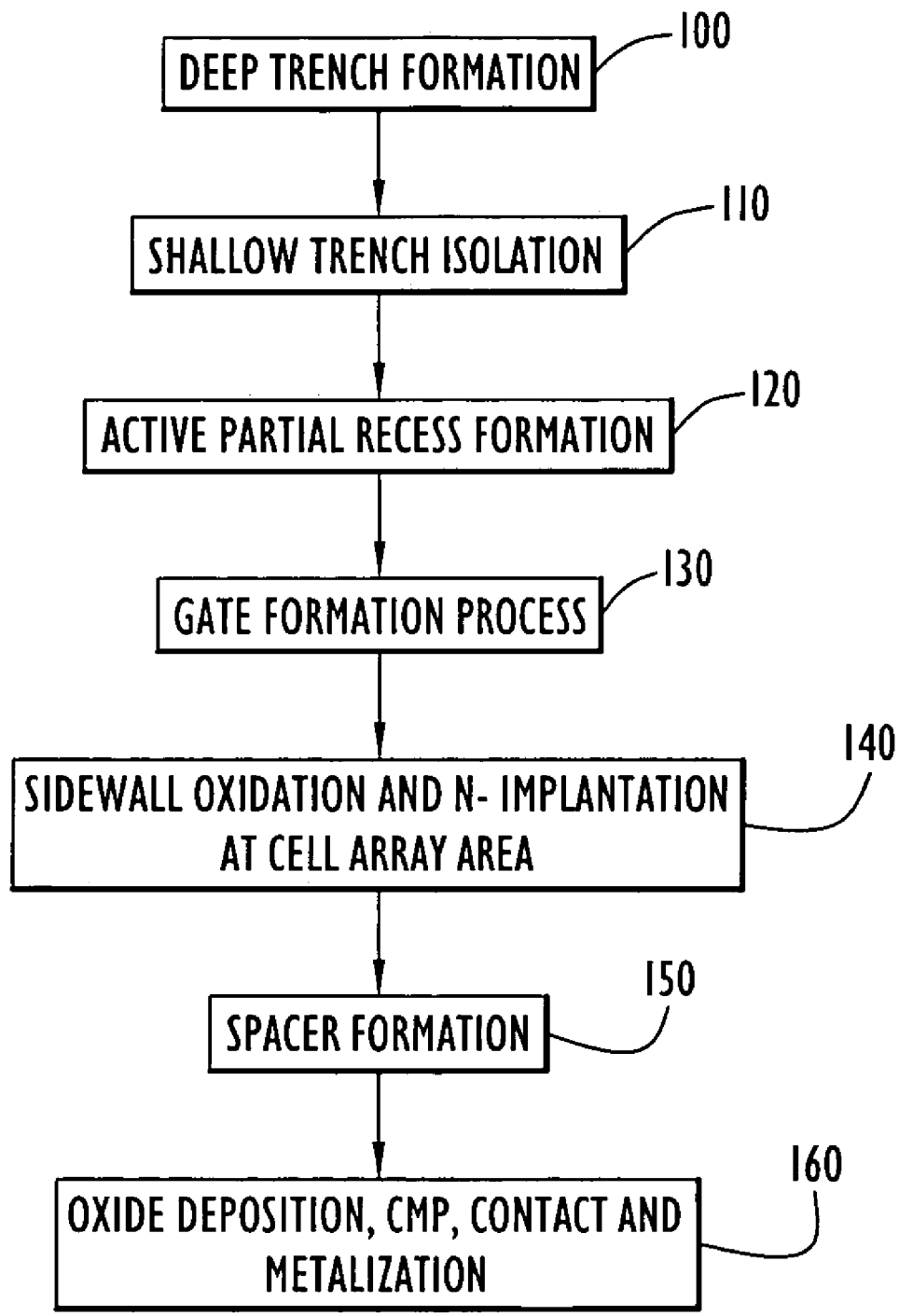
FIG. 1 is a flow chart depicting processing steps for making a recessed DRAM structure.

Referring first to FIG. 1, a flowchart illustrating the processing steps for fabricating a partially-recessed DRAM structure will be described. The fabrication procedure comprises a deep trench formation 100, shallow trench isolation 110, active partial recess formation 120, gate formation 130, sidewall oxidation and N-implantation 140, spacer formation 150 and an oxide deposition, CMP, contact and metallization process 160.

These processing steps will be described in greater detail in connection with FIGS. 2-17. In FIGS. 2-18, reference numeral 200 refers to the partially-recessed DRAM cell structure that is fabricated by the steps shown in FIG. 1. Additional reference numerals will be used to refer to various parts of the DRAM cell structure 200. Furthermore, the cell structure 200 shown in these diagrams includes two storage cells side-by-side whose structures mirror each other, as is known in the art.

Figure 2:
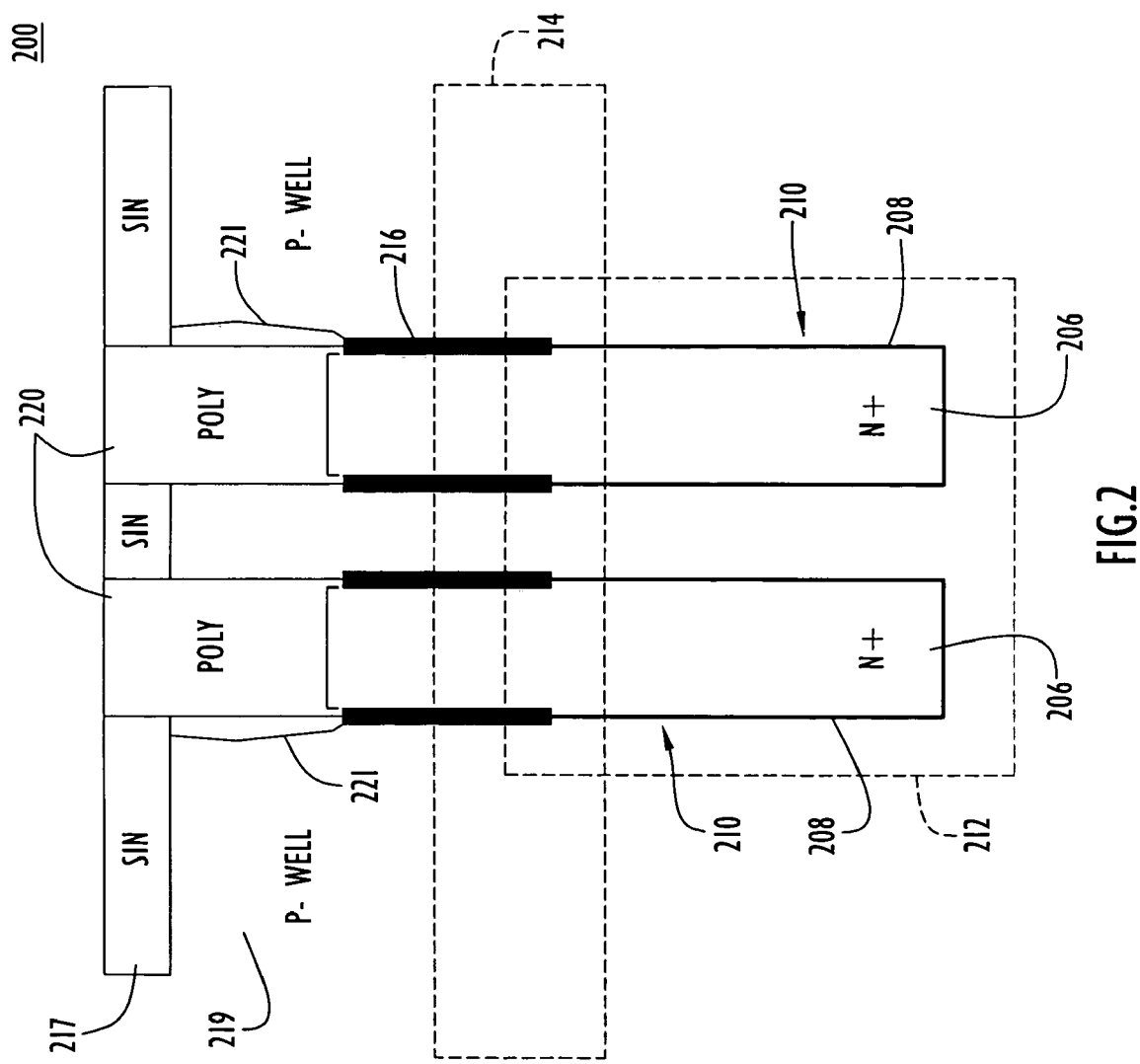
FIGS. 2-17 are diagrams showing cross-sectional views of the DRAM structure at various stages of the process shown in FIG. 1, where.

With reference to FIG. 2, in step 100, a conventional DRAM deep trench (DT) process is performed whereby DT capacitors 210 are formed having a polysilicon (N+) fill 206 and silicon oxide (oxide) 208 grown on its walls. As known in the art, the DT capacitors 210 each are a means for storing a charge. Control of access to the charge is made by way of a field effect transistor (FET) having a source, drain and gate associated with each storage cell. For purposes of the description hereinafter, the DT capacitors 210 are referred to as first and second DT capacitors. Associated with the first DT capacitor storage cell is a first FET comprising a first source, first drain and first gate. Likewise, associated with the second DT capacitor storage cell is a second FET comprising a second source, second drain and second gate. The following description refers to the structure of one storage cell, but it is to be understood that it is the same for the companion storage cell.

To this end, there are buried plate layer 212 and a buried band layer 214 of N-type material for plate contact for the DT capacitors 210. A collar oxide layer 216 is grown around a top portion of each of the trenches and a polysilicon layer 220 extends above the trenches of the DT capacitors 210. A silicon nitride (SIN) layer 217 is formed at the top surface overlying a P-well 219. In addition, there is a buried strap 221 around the polysilicon layer 220. The source of the FET controls the transport of charge to and from the DT capacitor 210. The gate of the FET controls transport of charge across a "channel" between the source and drain of the FET.

Figure 3:
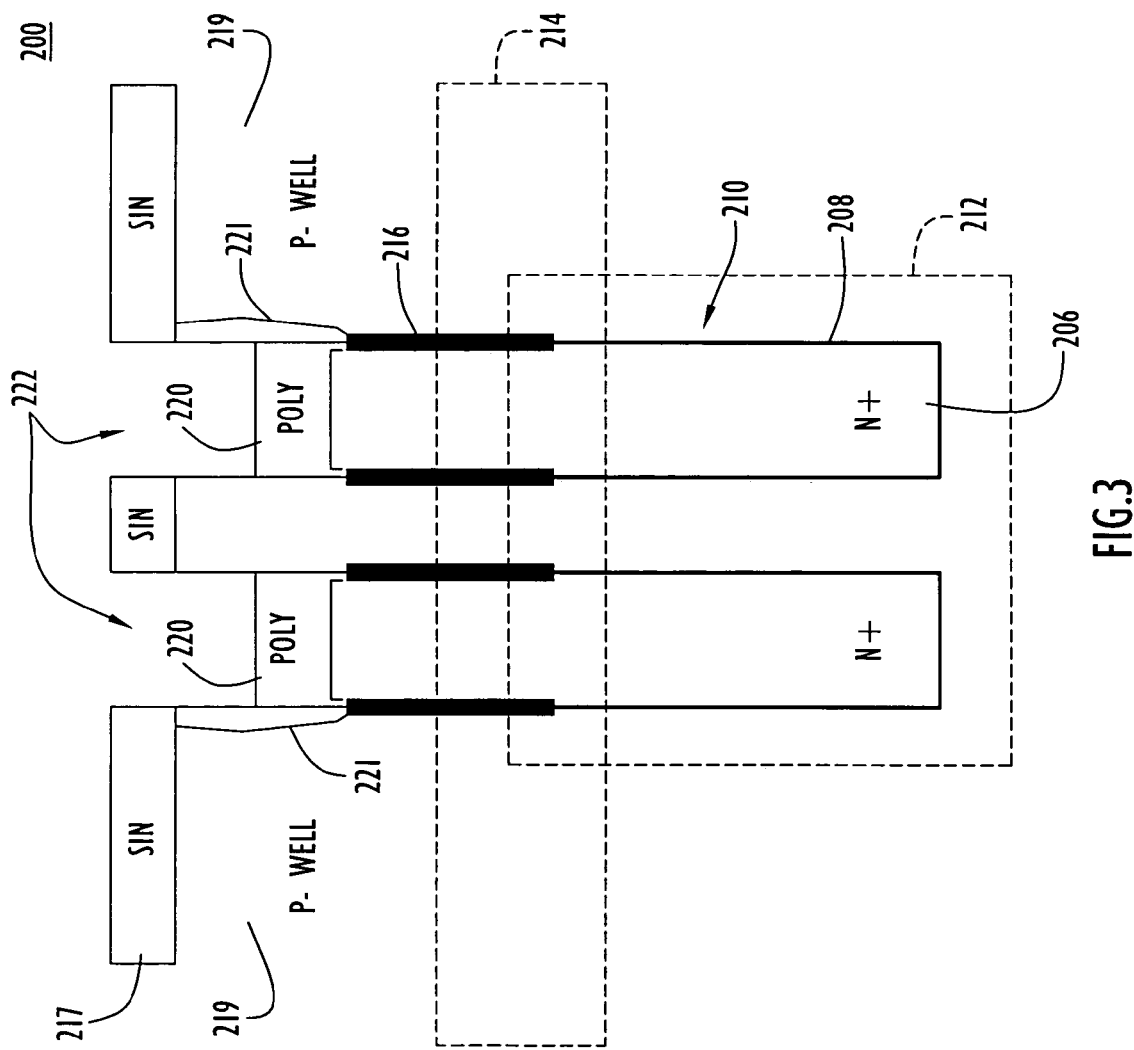

Turning to FIG. 3, a DT top polysilicon recess process 110 is performed whereby the polysilicon layers 220 overlying the trenches of the DT capacitors 210 are etched thereby forming recesses 222. The recesses 222 into the polysilicon layers 220 are as deep as the "active" recess depth, and thus, are deeper than that in conventional STI for reasons that will become more apparent below.

Figure 4:
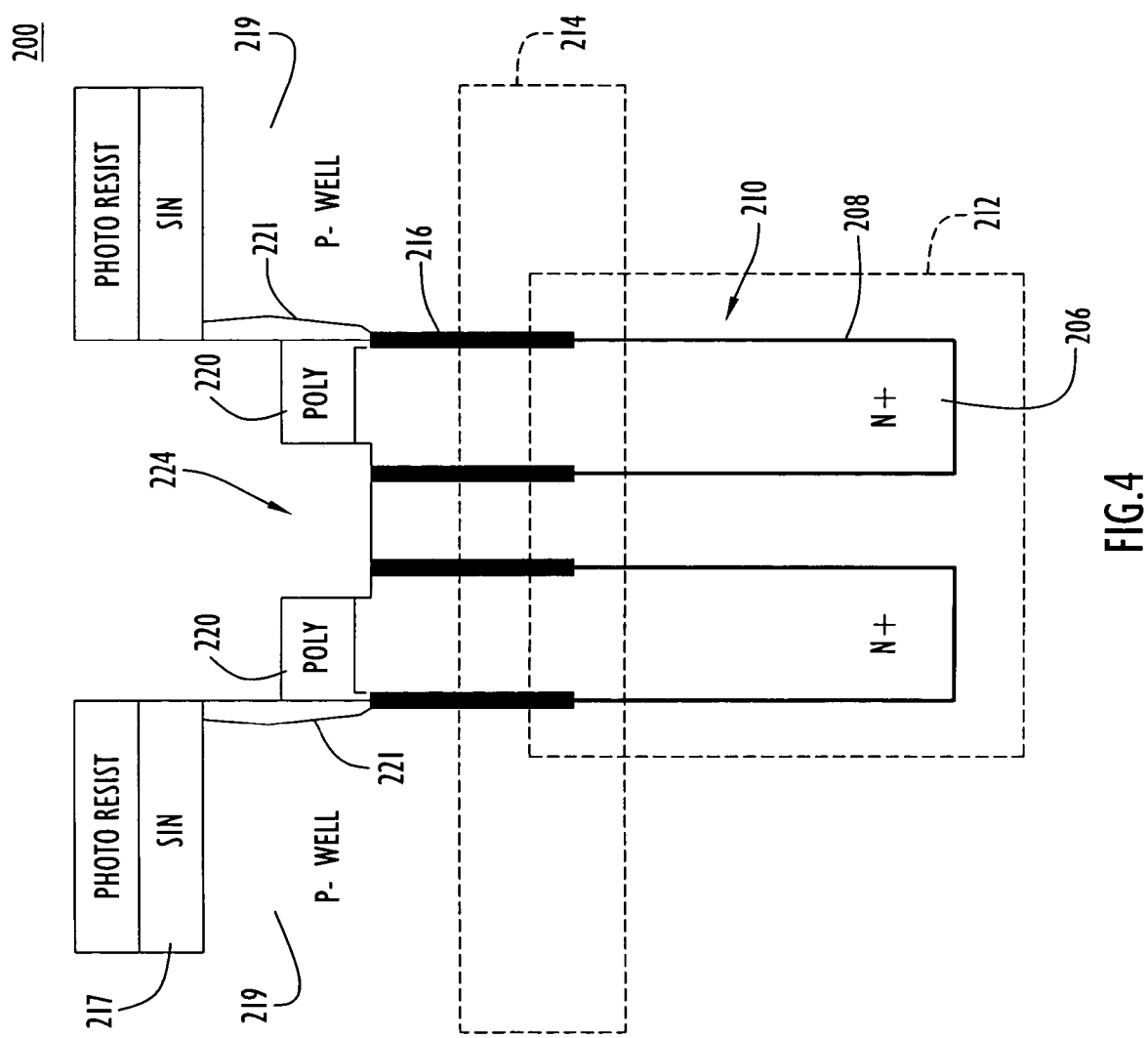
Figure 5:
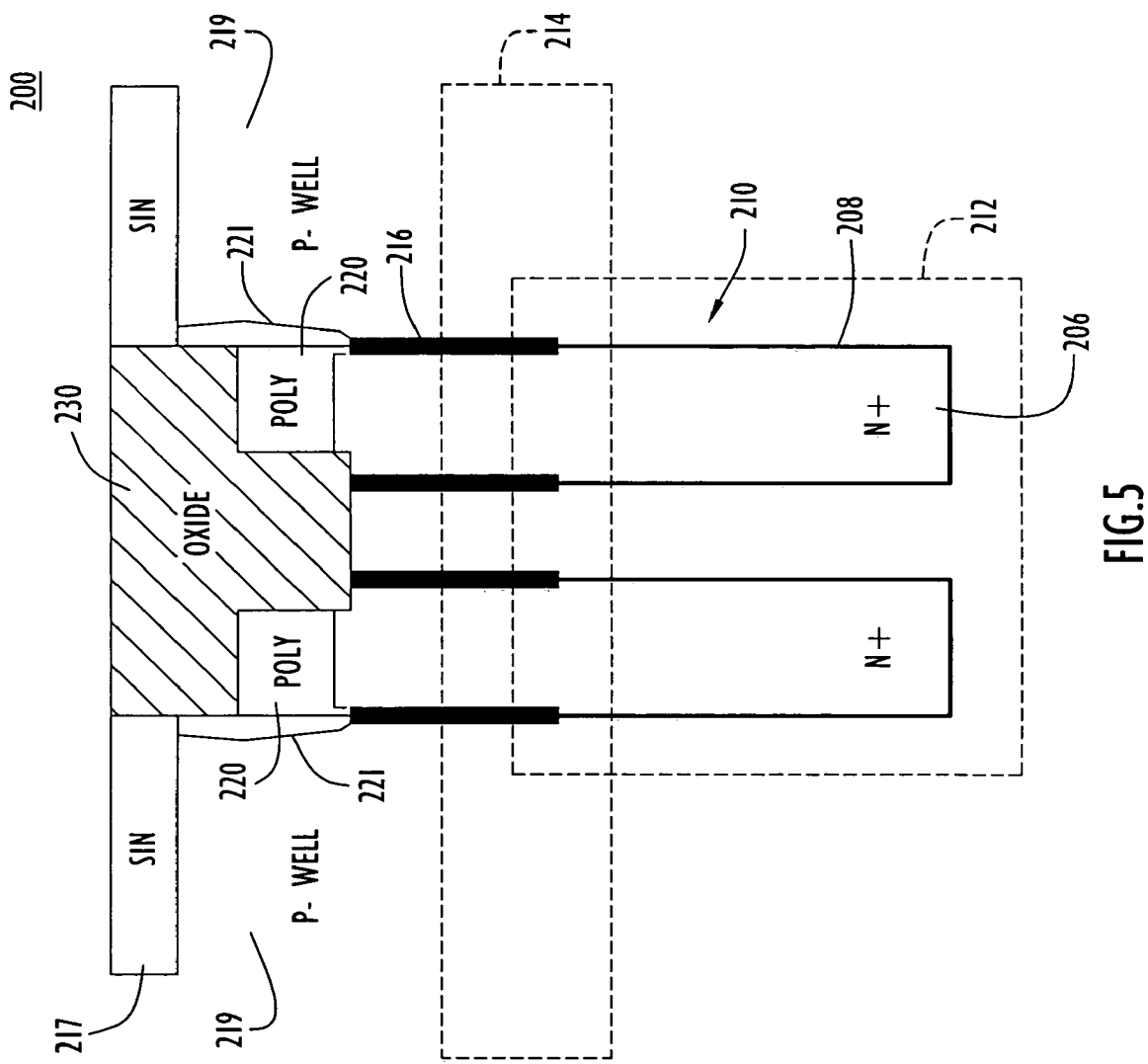

In FIG. 4, active area lithography and silicon etching is shown whereby a shallow isolation trench 224 is formed. In FIG. 5, the shallow trench 224 is filled with oxide to form an isolation layer 230 that also overlies the polysilicon layers 220. The isolation layer 230 is also subjected to chemical-mechanical polishing (CMP).

Figure 6:
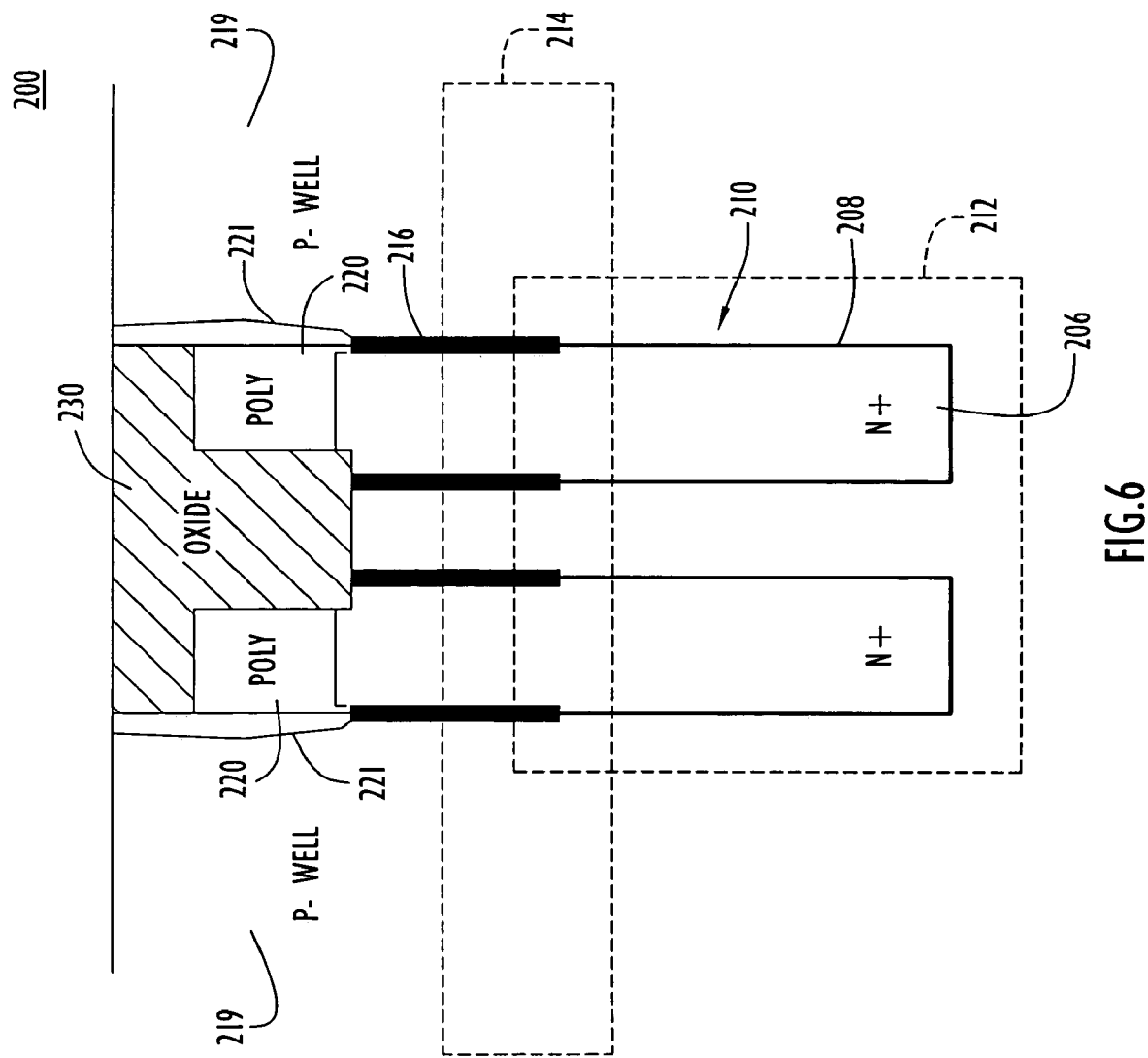

In FIG. 6, the SIN layer 217 and a portion of the oxide isolation layer 230 are removed by wet etching. The thickness of the isolation layer 230 above the poly-silicon layer 220 is as thick as the "active" recess depth, and consequently is thicker than that formed in the conventional DRAM cell structure.

Figure 7:
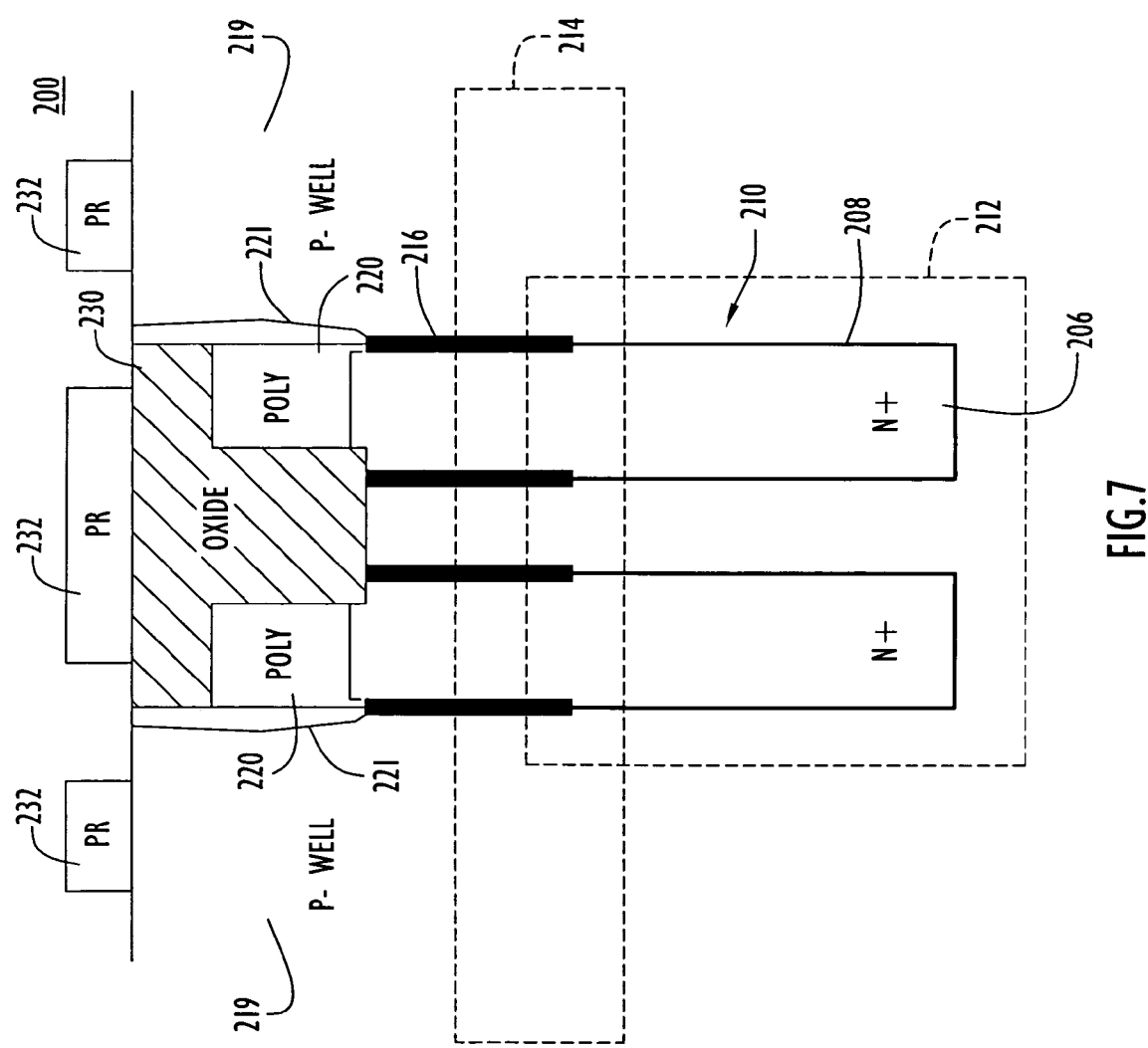
Figure 8:
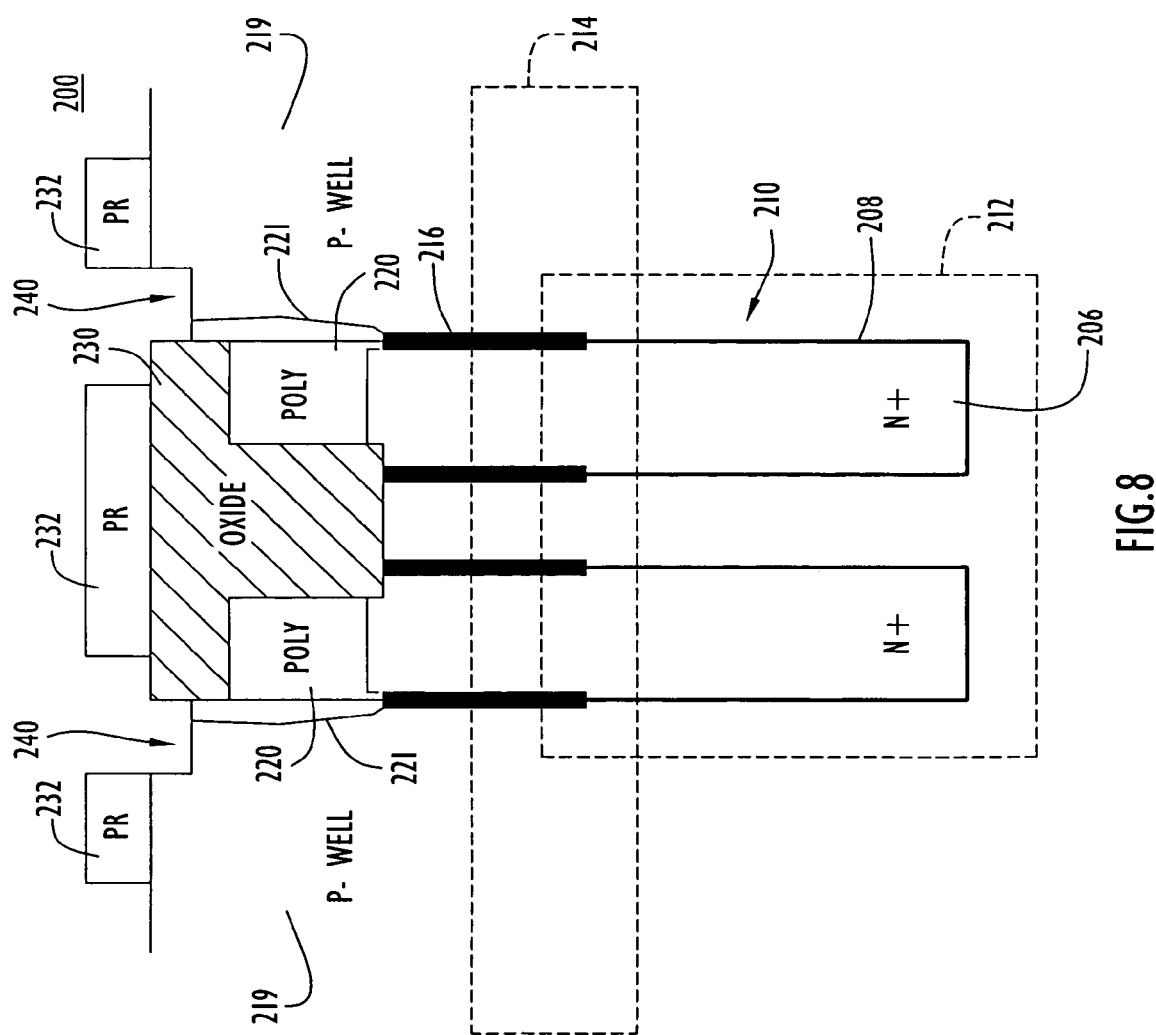

With reference to FIGS. 7 and 8, the recess formation step 120 is shown whereby photoresistive (PR) material 232 is applied on the surface of the substrate in a desired pattern for formation of a recess on opposite sides of the isolation shallow trench isolation layer 230 proximate corresponding DT capacitors 210. The unmasked area corresponds to the areas where formation of a recess 240 (one recess proximate each deep trench capacitor 210) will occur after etching. The recesses 240 are etched to a controlled depth that is only partially as deep as that used in conventional deep trench DRAM cell structures. Each recess 240 comprises side walls of generally vertical surfaces and a floor of a generally horizontal surface. As will become apparent hereinafter, the recesses 240 are etched to a depth in the substrate that is greater than a depth of the corresponding drain such that a junction of the first source with the channel region and a junction of the first drain with the channel region are not in the same plane, and a junction of the second source with the channel region and a junction of the second drain with the channel region are not in the same plane. The peripheral active area is masked by PR material 232 and is not recessed. The PR material 232 is then removed.

Figure 9:
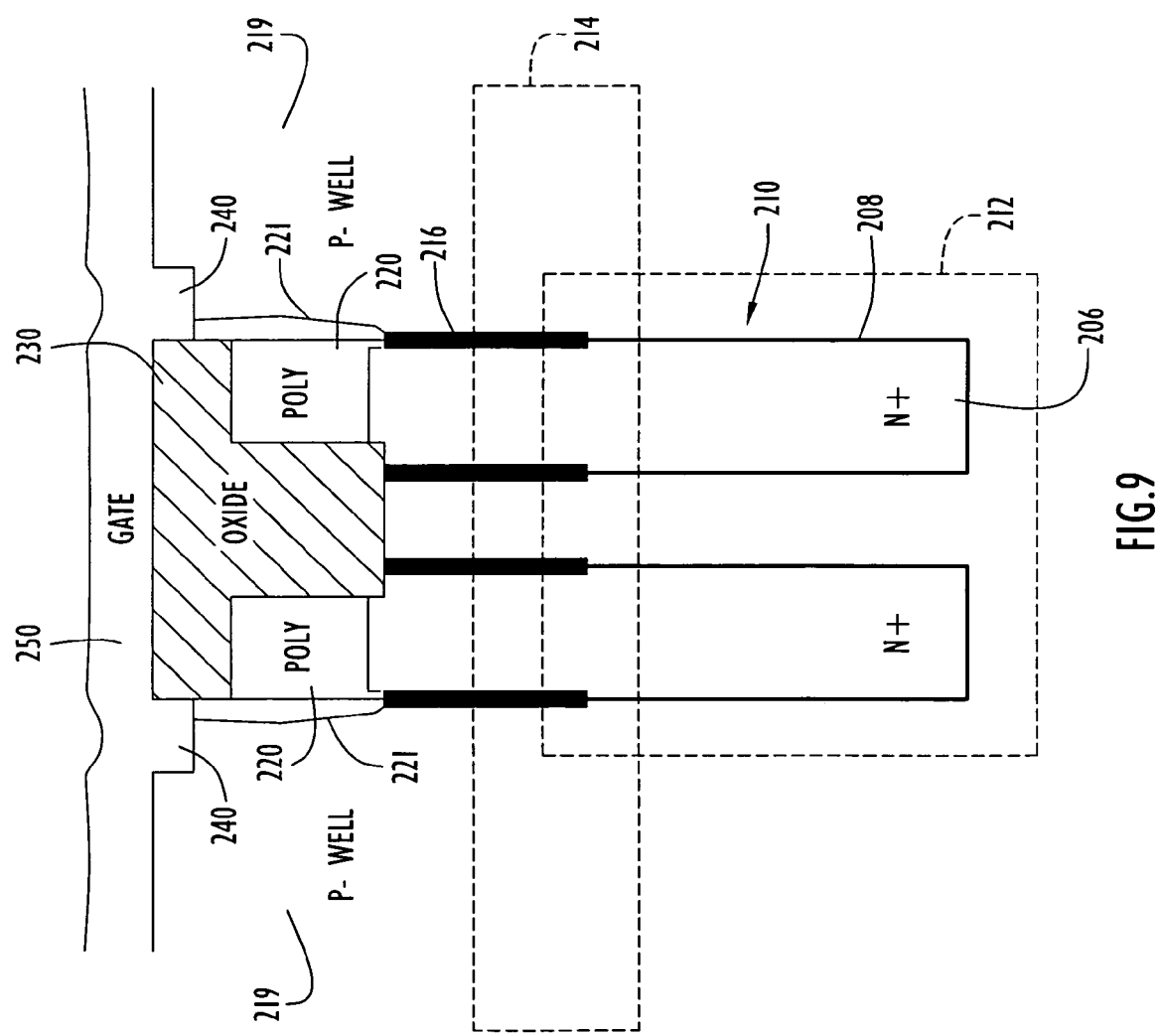
Figure 10:
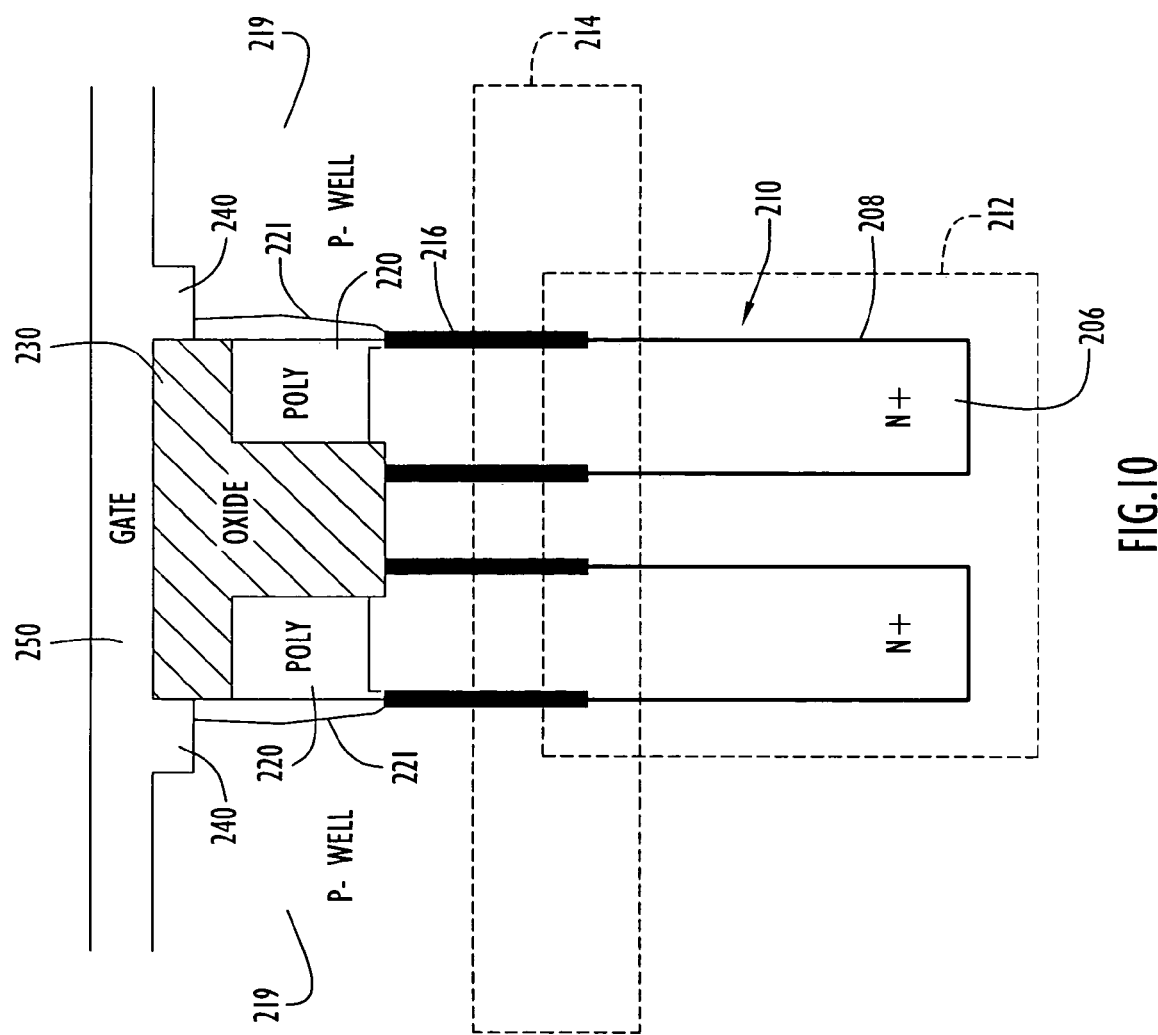
Figure 11:
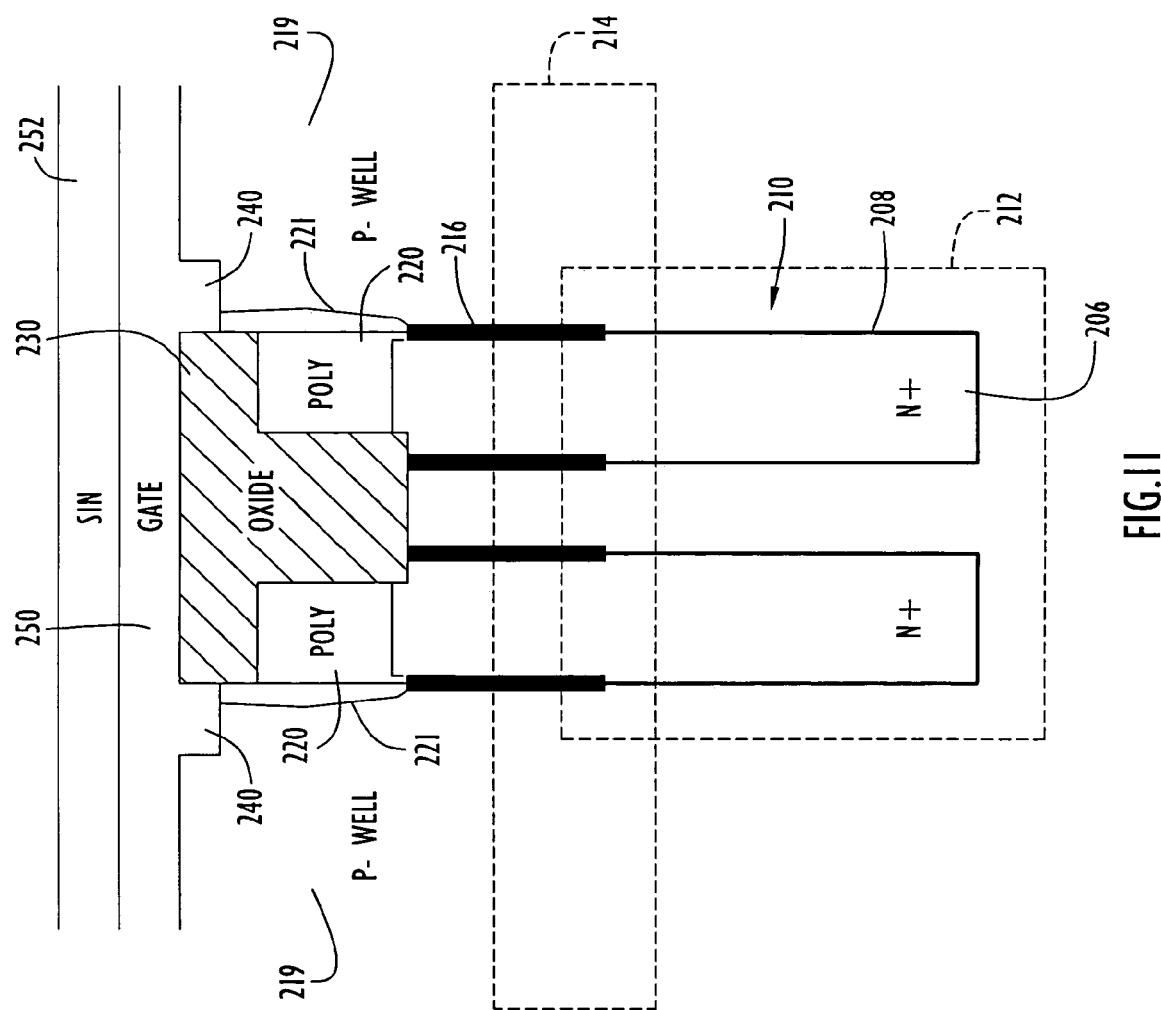
Figure 12:
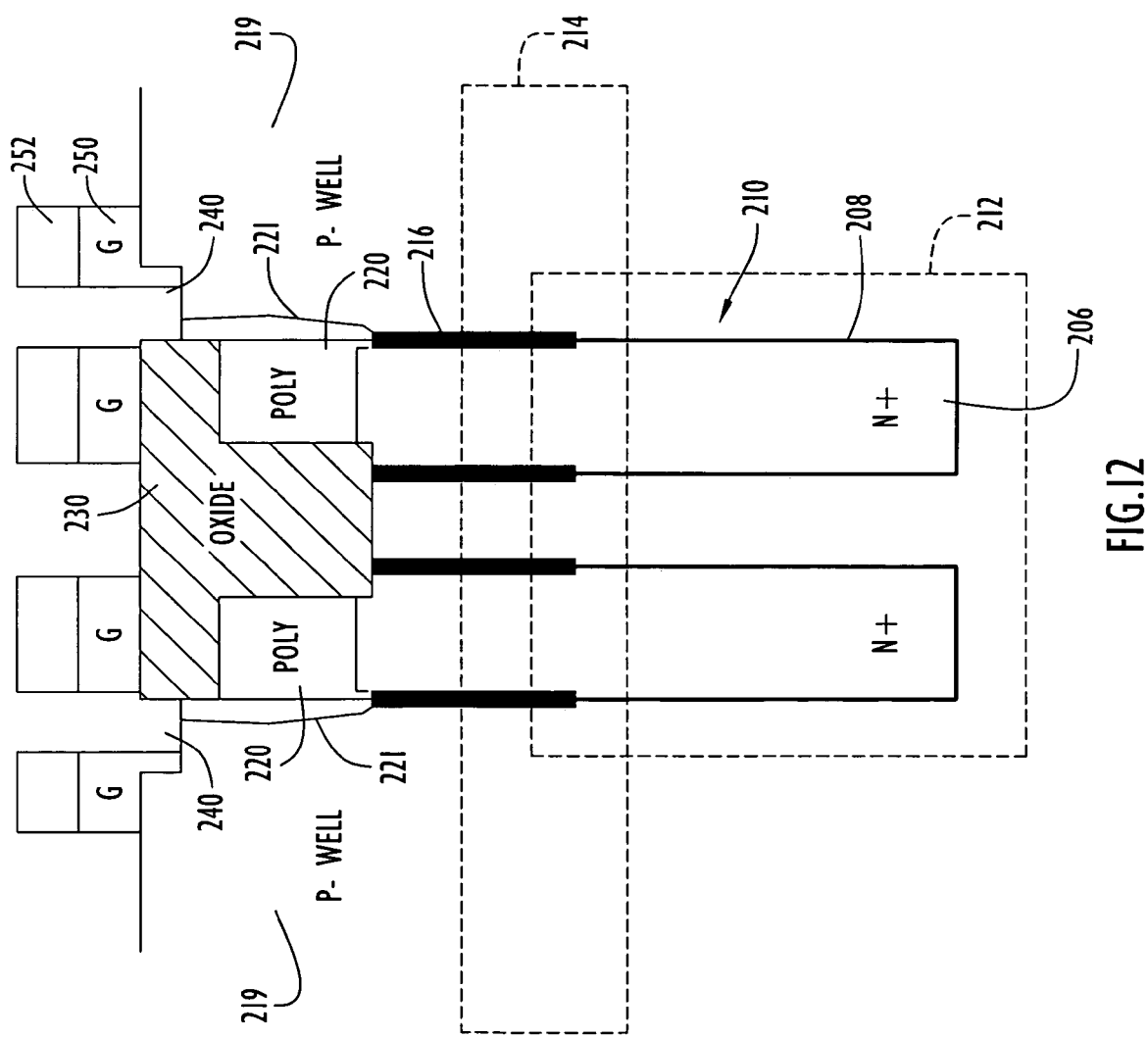

Turning to FIGS. 9-12, the gate formation process 130 is performed. FIG. 9 shows deposition of gate material 250 on the substrate surface and into the recess 240 on each side of the isolation layer 230. FIG. 10 shows the gate material being subjected to CMP. FIG. 11 shows deposition of SIN on the gate material 252. FIG. 12 shows the result of gate pattern lithography and etching whereby after etching, gate material extends into the recess 240 (but does not completely occupy the recess 240) on each side of the isolation layer 230. Thus, as shown in FIG. 12, the gate 250 overlies a shoulder and extends entirely down one vertical side wall of the recess 240.

Figure 13:
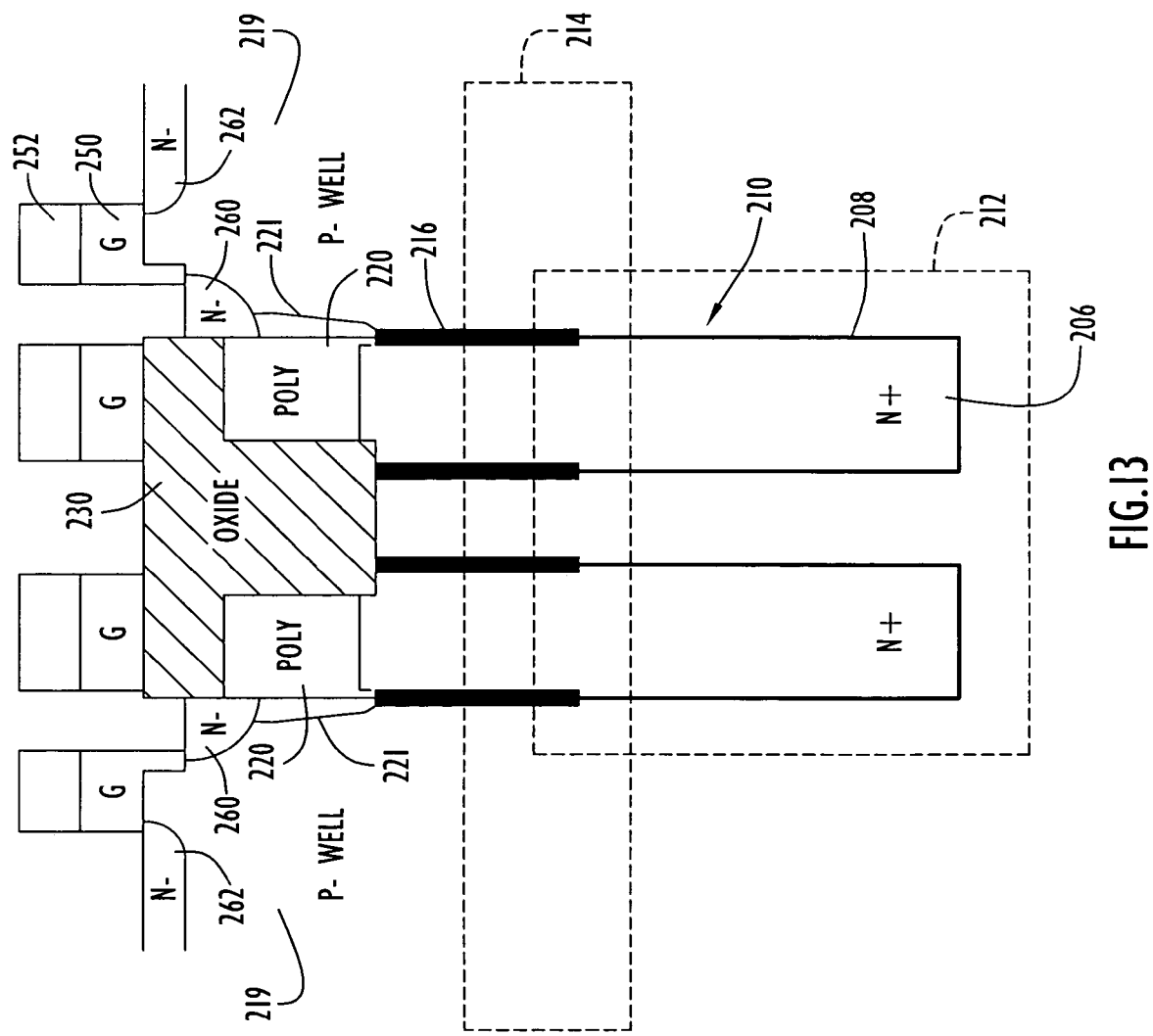

With reference to FIG. 13, the sidewall oxidation and doping implantation process 140 at the cell array area is shown to whereby oxide is grown on the gate side wall. In addition, dopant is implanted to create the N− doped source region 260 and N− doped drain region 262. As shown in this figure, the source 260 and drain 262 are not at the same level in the cell structure. The drain 262 is at a higher or elevated level in the substrate with respect to the source 260. Said another way, in the DRAM cell structure 200, the source 260 and drain 262 are not aligned on the silicon surface, unlike the conventional DRAM cell structure. In this sense, the drain and source are asymmetrically positioned with respect to the silicon surface in the DRAM cell structure 200. The oxide grown on silicon surface beneath the gate on the side wall of the recess (that the gate overlies) forms a majority of the channel between the source 260 and drain 262.

Figure 14:
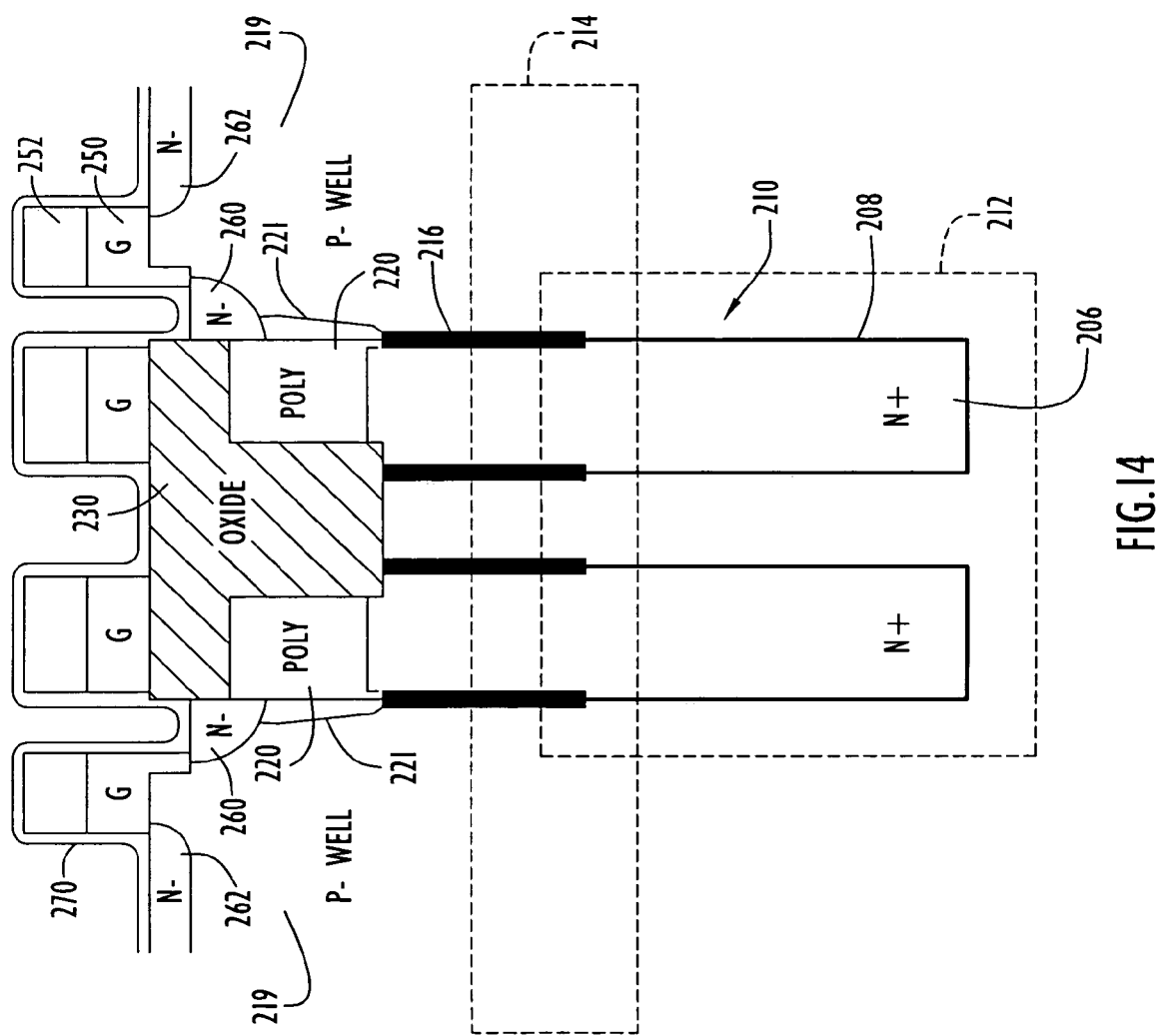
Figure 15:
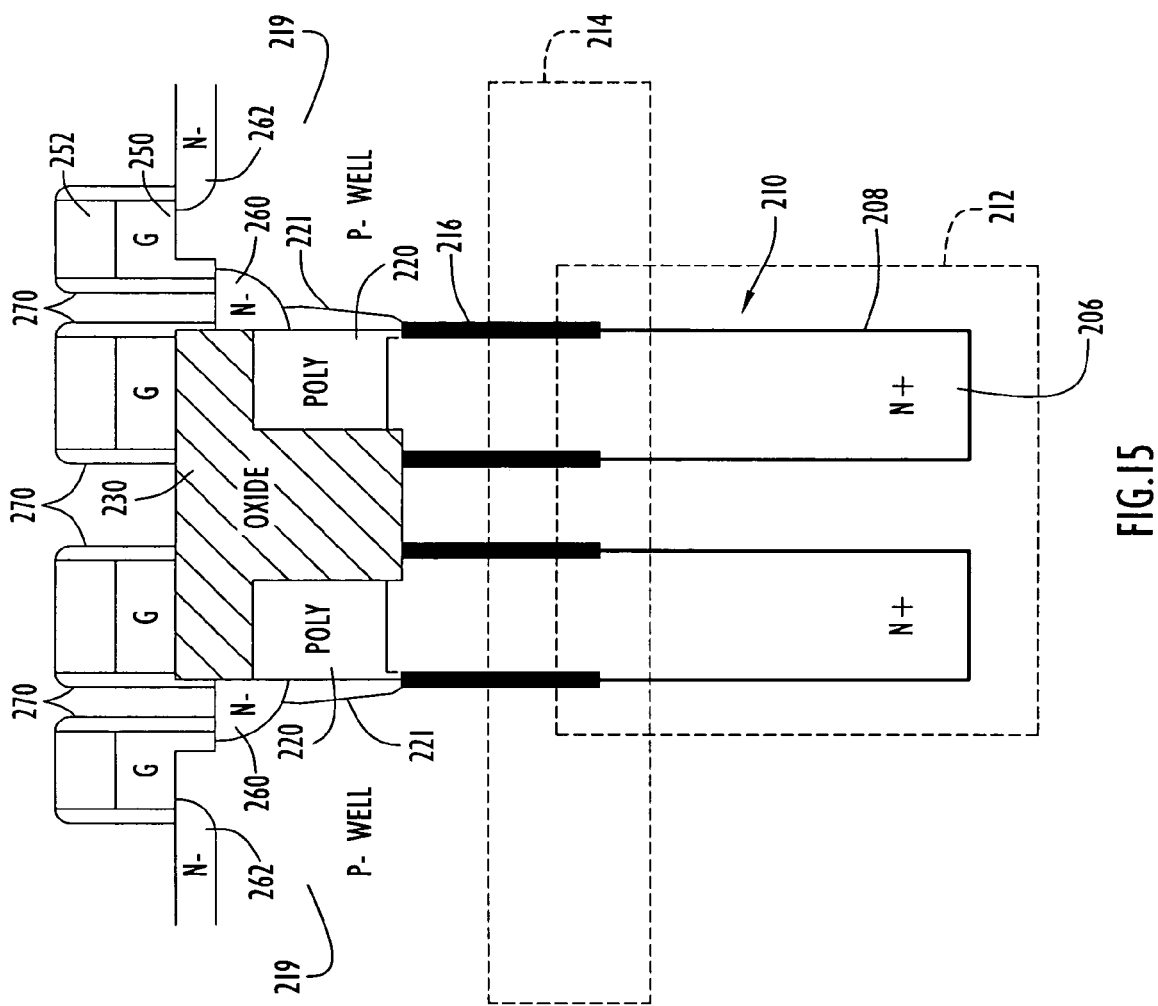

With reference to FIGS. 14 and 15, the spacer formation step 150 is shown. FIG. 14 illustrates the deposition of the SIN spacer material 270 and FIG. 15 illustrates etching of the spacer material 270.

Figure 16:
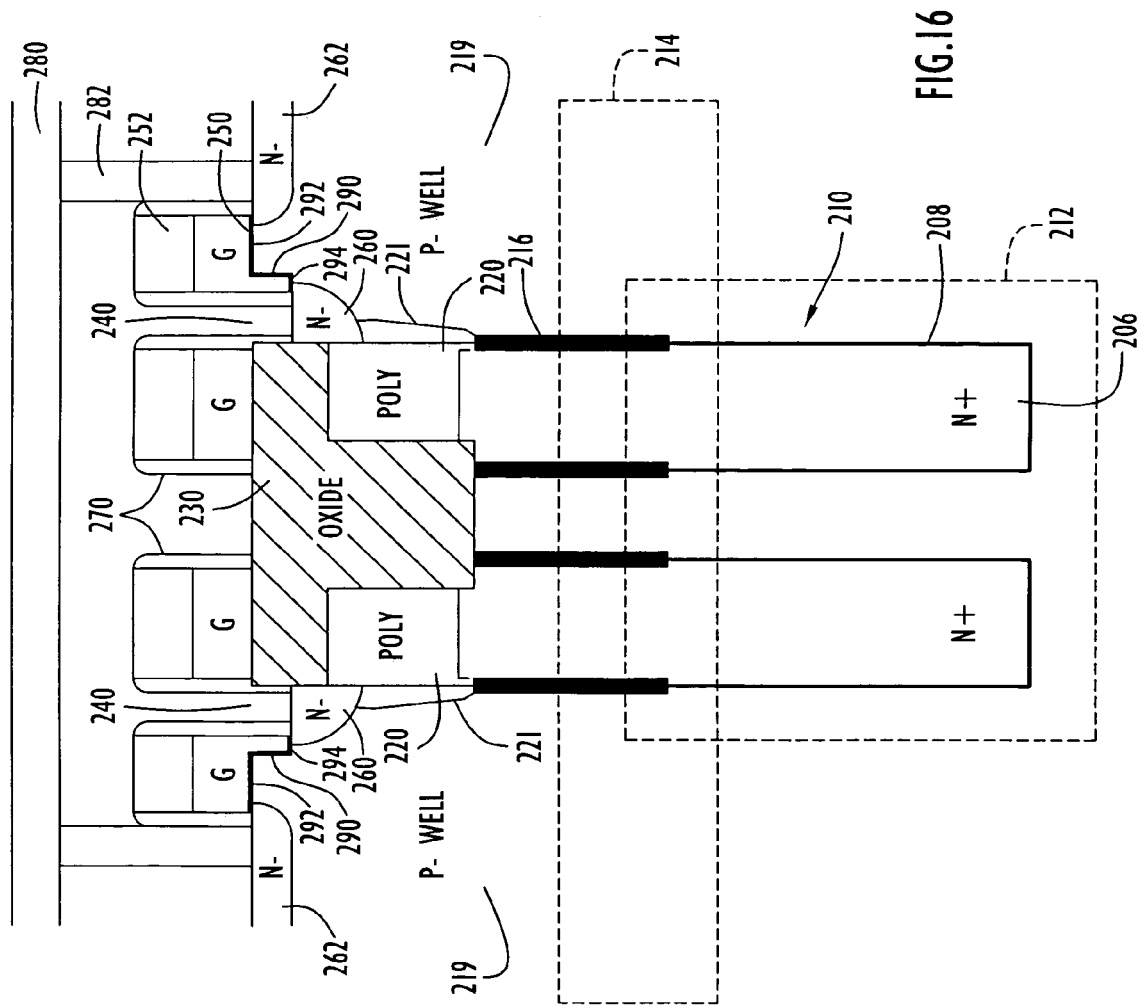

FIG. 16 illustrates the DRAM structure after conventional oxide deposition, oxide CMP, formation of the contacts and metallization of step 160. The recess 240 is designed to be of a depth such that all of the gates in the cell array area and peripheral circuit area are at the same level or height even though the gate area in the cell array is recessed partially. A bit line 280 makes contact via a bit line contact 282 with the drain 262.

An important benefit of the partially recessed DRAM structure is that the channel between the source region 260 and drain region 262 comprises a (vertical surface of a) side wall 290 of the recess 240, a (horizontal surface) portion 292 of a horizontal surface above the recess and connected to the side wall 290 and a (horizontal surface) portion 294 of the floor of the recess 240. The channel surfaces 290, 292 and 294 are located beneath the gate material area 250 defined by gate lithography and are surfaces on which silicon oxide is grown for channel formation. In one embodiment, the gate material may be formed only on the side wall and on a portion of the floor surface of the recess, and not on a horizontal surface above the recess. Thus in this embodiment, the channel surfaces are 290 and 294 and not 292.

The junction of the source 260 with the channel is lower in the substrate than (i.e., not in the same plane) as the junction of the drain 262 with the channel. As shown in FIG. 16, the junction of the source with the channel is at the portion 294 of the floor of the recess and the junction of the drain with the channel is at the portion 292 of the horizontal surface above the recess 240. This structure is duplicated for both storage cells. The partial recess 240 creates a longer and predominantly vertical channel region between the source 260 and drain 262 which makes the DRAM structure more amenable to be scaled-down for smaller semiconductor fabrication technologies without the FET short-channel effect, and eliminates the need for higher doping concentrations. The horizontal surfaces 292 and 294 and side wall surface 290 determine the effective channel length of the cell FET. Again, because the channel is primarily defined by the vertical side wall of the recess, this DRAM cell structure is much more suitable to smaller fabrication techniques as the cell FET channel length shrinks more. Providing a greater separation between the drain and the buried strap source region allows for more control on the channel doping concentration near the buried strap because the channel length is mainly determined by the depth of the partial recess 240. Moderate channel doping can be achieved to obtain a desirable target threshold voltage. The junction leakage can be reduced by separating the bit line contact drain region 262 from the trench poly-silicon contact source region 260 and reducing the channel doping. In addition, this partially recessed DRAM structure does not suffer from floating body effects when scaled-down because the distance between the buried strap contacts is sufficient. With buried strap diffusion, the source region 260 of the cell FET can be connected with the trench capacitor storage polysilicon fill 206.

As is known in the art of DRAM integrated circuit (IC) design, a word line controls access to a row or column of storage cells and connects to the gates of the FETs for each of those cells. There is a bit line for each storage cell that connects to the drain for that storage cell. For example, in FIGS. 17 and 18, there is a first bit line contact that makes electrical contact with the first drain associated with a first of the two storage cells shown, and a second bit line contact that makes electrical contact with the second drain associated with the second of the two storage cells. The gates of both storage cells make contact with the same word line.

Figure 17:
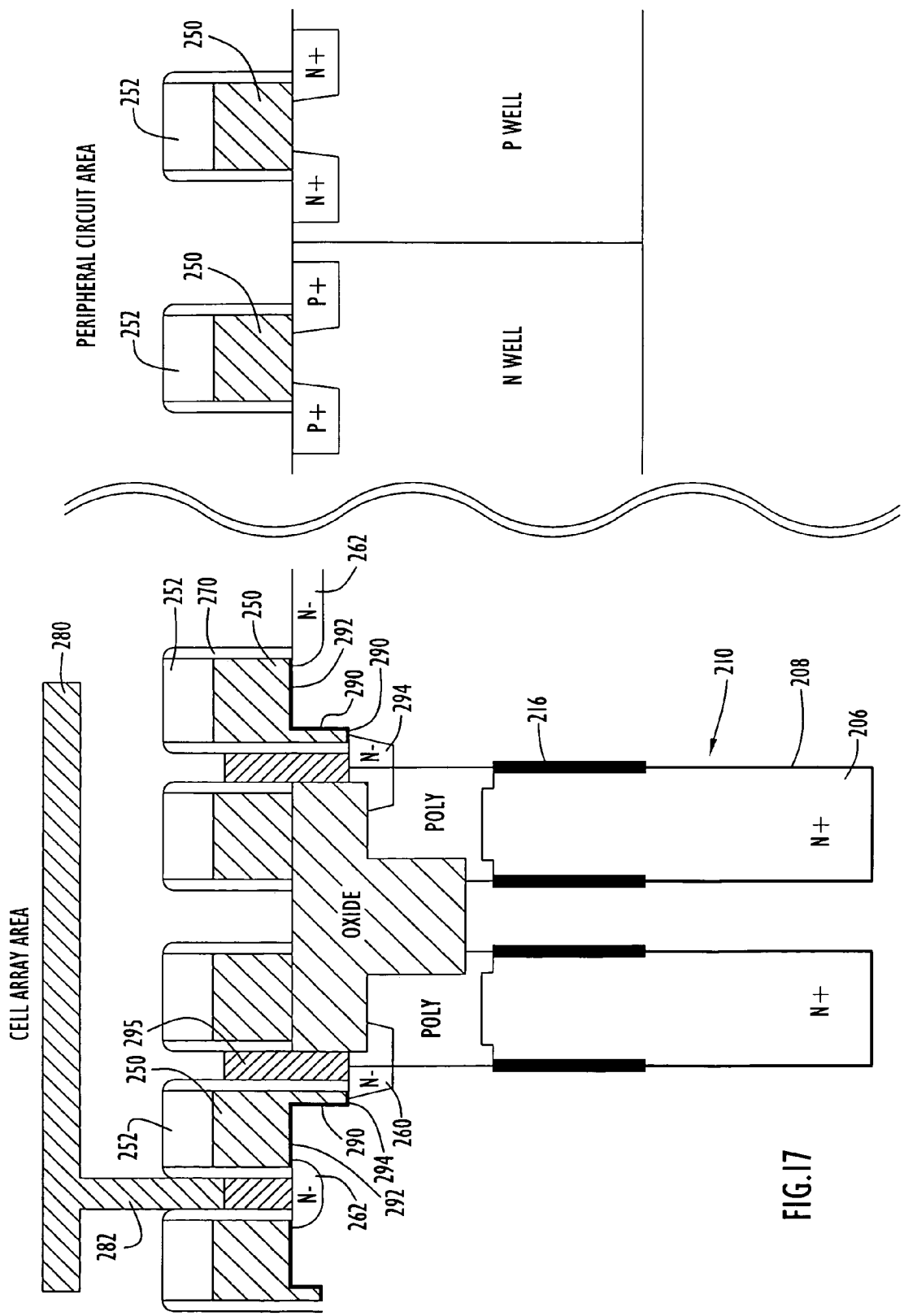
Figure 18:
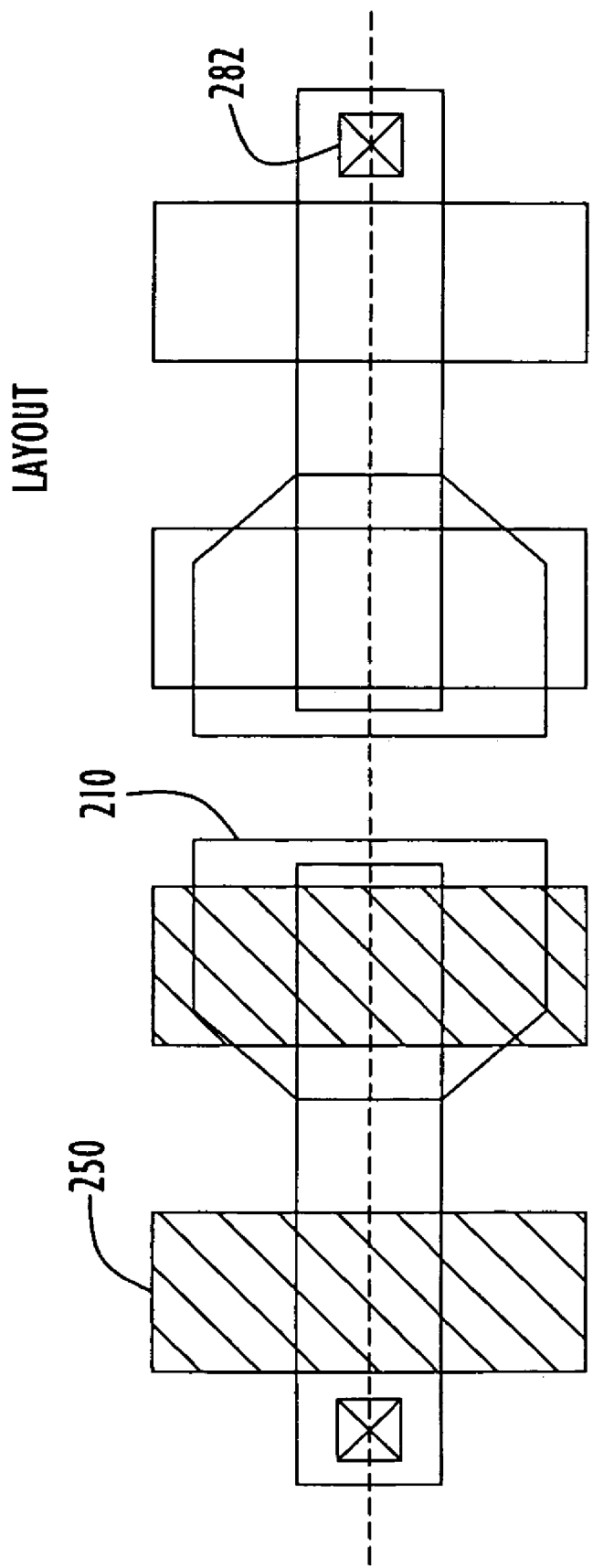
FIG. 18 illustrates a layout of a partially recessed DRAM structure.

Turning to FIGS. 17 and 18, an alternative embodiment of the partially recessed DRAM structure is shown in which the source region 260 is connected to the trench capacitor storage polysilicon fill 206 by using only N-implantation. A plug 295 of polysilicon may optionally be integrated as shown to reduce resistance between the source region 260 and the trench capacitor storage polysilicon fill 206. In the DRAM structure shown in FIGS. 17 and 18, the word line corresponds to the gate 250. The plug 295 helps to eliminate the buried strap diffusion that can cause problems as the cell feature size is scaled-down.

Figure 19:
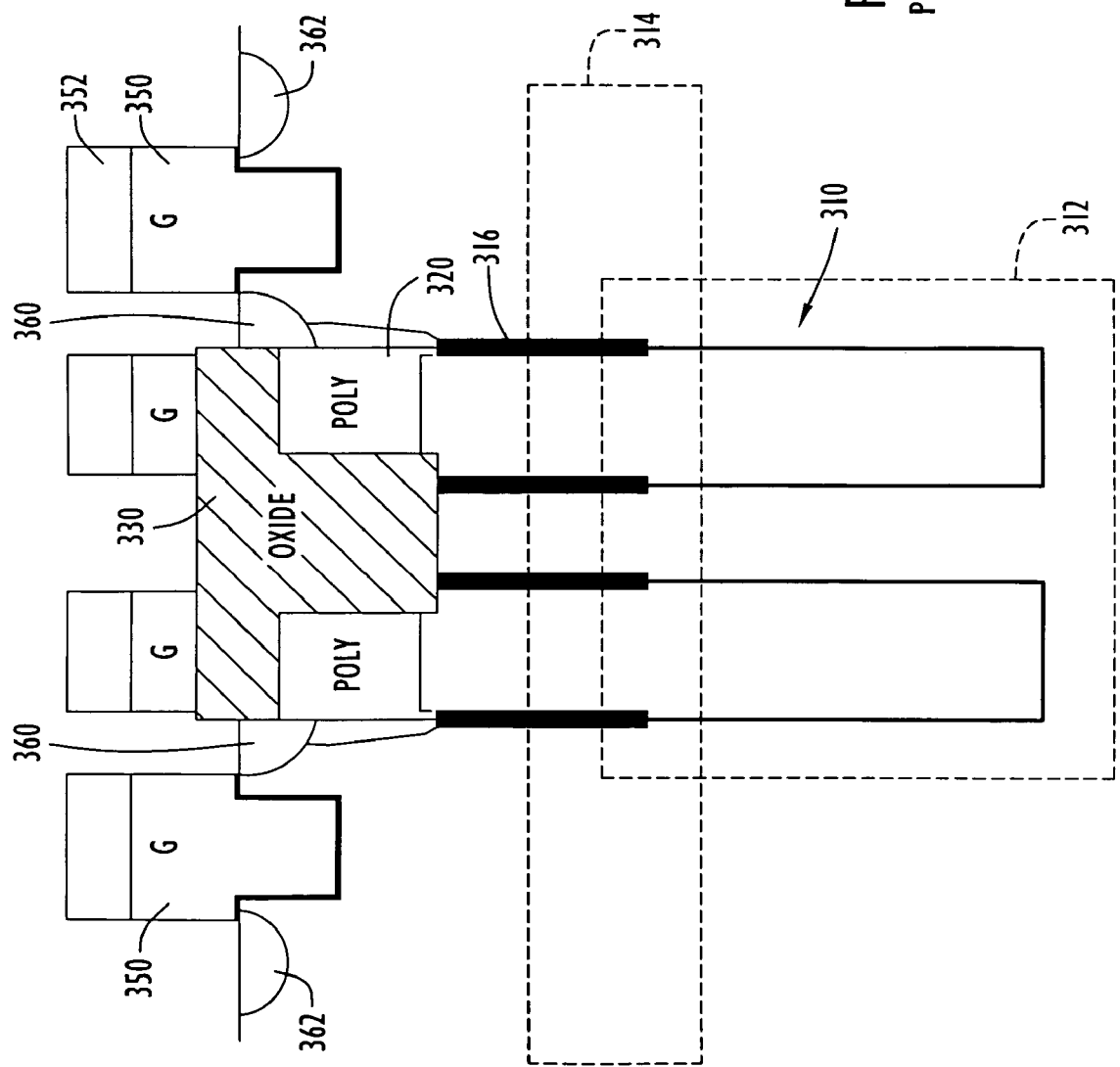
FIG. 19 illustrates a cross-section of a conventional fully recessed DRAM structure.

For comparison purposes, FIG. 19 illustrates a conventional trench DRAM structure 300 with a fully recessed cell. In this structure, the junction of the source with the channel 390 and the junction of the drain 362 with the channel are at the same or plane in the substrate. The gate 350 is more fully recessed and the channel 390 is defined as the vertical walls and horizontal bottom of the gate 350. It is difficult to make good contact resistance with the trench capacitor 310 due to the reduced silicon opening by the T-shape of the gate 350. In order to make sufficient contact, this area must be increased and consequently no benefit can be achieved if scaled-down except for an increased gate length. Moreover, the poly-dopant out-diffusion at this area can damage gate oxide quality and reduce the threshold voltage and increase gate induced drain leakage (GIDL).

To summarize, a DRAM cell structure is provided, comprising: a deep trench capacitor formed in a substrate; a recess formed in the substrate proximate the deep trench capacitor; a gate extending into but not completely occupying the recess; a source in the substrate beneath the recess; and a drain in the substrate laterally and vertically offset from the source whereby a channel between the source and drain is created beneath the gate along a side wall of the recess. In one form, the gate material may be formed only on the side wall and on a portion of the floor surface of the recess, and not on a horizontal surface above the recess.

Similarly, a DRAM cell structure is provided, comprising: a deep trench capacitor formed in a substrate; a polysilicon layer overlying the deep trench capacitor; a recess formed in the substrate proximate the deep trench capacitor; a gate formed at the recess but not completely occupying the recess to create a channel comprising a vertical side wall of the recess, a portion of a horizontal surface above the recess connected to the side wall and a portion of a horizontal surface of a floor of the recess connected to the side wall; a source formed by doping the substrate in a region beneath the recess proximate the polysilicon layer; and a drain in the substrate formed by doping the substrate in a region laterally and vertically offset from the source by the channel.

Moreover, a DRAM cell structure is provided, comprising: deep trench capacitance means formed in a substrate for storing a charge; recess means in an active area of the substrate proximate the deep trench capacitance means; source region means formed in the substrate beneath the recess means for transporting charge to and from the deep trench capacitance means; drain region means formed in the substrate laterally and vertically offset from the source region means; and gate region means having silicon oxide on a side wall and a portion of a floor of the recess means for controlling charge transport across the channel between the source region means and drain region means.

Still further, a DRAM cell structure is provided comprising: first and second deep trench capacitors formed in a substrate, each deep trench capacitor filled with polysilicon and having silicon oxide grown on its walls; a polysilicon layer overlying the first and second deep trench capacitors; an isolation layer of silicon oxide material formed in the substrate between a top portion of the first and second deep trench capacitors and extending over the polysilicon layer; a first recess formed in the substrate proximate the first deep trench capacitor on a first side of the isolation layer; a second recess formed in the substrate proximate the second deep trench capacitor on a second side of the isolation layer; a first gate formed at the first recess but not completely occupying the first recess having silicon oxide on a side wall of the first recess; a second gate formed at the second recess but not completely occupying the second recess having silicon oxide on a side wall of the second recess; a first source formed by doping the substrate in a region beneath the first recess; a first drain in the substrate formed by doping the substrate in a region laterally and vertically offset from the first source; a second source formed by doping the substrate in a region beneath the second recess; and a second drain in the substrate formed by doping the substrate in a region laterally and vertically offset from the second source. Furthermore, a first channel between the first source and the first drain comprises silicon oxide on a portion of a horizontal surface above the first recess connected to the side wall of the first recess, and on a portion of a floor of the first recess connected to the side wall of the first recess, and a second channel between the second source and second drain comprises silicon oxide on a portion of a horizontal surface above the second recess connected to the side wall of the second recess and on a portion of a floor of the second recess connected to the side wall of the second recess.

Further, a method for making a DRAM cell structure is provided comprising: forming a deep trench capacitor in a substrate; forming a recess in the substrate proximate the deep trench capacitor; forming a gate extending into the recess; forming silicon oxide along a side wall of the recess beneath a surface of the gate; implanting dopant in the substrate in a region beneath the recess to form a source; and implanting dopant in the substrate in a region laterally and vertically offset from the source to form a drain, whereby a channel between the source and drain is created beneath the gate along the side wall of the recess. Moreover, silicon oxide is formed on a portion of a horizontal surface above the recess connected to the side wall and on a portion of a floor of the recess connected to the side wall.

Said another way, a method for making a DRAM cell structure is provided comprising: forming a deep trench capacitor in a substrate; forming a recess in the substrate proximate the deep trench capacitor, the recess having side walls and a floor; forming a gate extending into the recess and overlying one side wall and a portion of the floor; forming silicon oxide beneath the surface of gate material associated with the gate along the side wall of the recess, the portion of the floor of the recess and a portion of a horizontal surface above the recess connected to the side wall of the recess; implanting dopant in the substrate in a region beneath the recess to form a source having a junction with the portion of the floor of the recess; and implanting dopant in the substrate in a region laterally and vertically offset from the source to form a drain that has a junction with the portion of the horizontal surface above the recess.

Further still, a method for manufacturing a DRAM cell structure is provided comprising: forming first and second deep trench capacitors in a substrate having a polysilicon layers overlying the first and second deep trench capacitors; removing a top portion of the polysilicon layers thereby forming a shallow trench in the substrate in a space between a top portion of the first and second deep trench capacitors; filling the shallow trench with silicon oxide material and over the polysilicon layers to form an isolation layer between the first and second deep trench capacitors; applying a photoresistive material on the surface of the substrate in a pattern to define areas for formation of first and second recesses on opposite sides of the isolation layer proximate the first and second deep trench capacitors, respectively; etching the substrate to form the first and second recess to a controlled depth at the areas not masked by the photoresistive material; depositing gate material on the substrate; depositing silicon nitride material on the gate material; etching a gate pattern such that the gate material extends into the first and second recess along a side wall of each of the first and second recesses; implanting dopant in the substrate in a region beneath the first and second recesses to form first and second sources, associated with the first and second deep trench capacitors respectively; and implanting dopant in the substrate in a region laterally and vertically offset from the first and second sources, respectively, to form first and second drains, and whereby a first channel between the first source and first drain is created beneath the gate material along the side wall of the first recess and a second channel between the second source and second drain is created beneath the gate material along the side wall of the second recess. Silicon oxide is grown beneath the gate material on the side walls of the first and second recesses, on a portion of a horizontal surface above the first recess connected to the side wall and on a portion of a floor of the first recess connected to the side wall, and on a portion of a horizontal surface above the second recess connected to the side wall and on a portion of a floor of the second recess connected to the side wall.

The DRAM cell structure and methods described herein may be embodied in other specific forms without departing from the spirit or essential characteristics thereof. The foregoing embodiments are therefore to be considered in all respects illustrative and not meant to be limiting.

What is claimed is:

1. A dynamic random access memory (DRAM) cell structure, comprising:
   a. a deep trench capacitor formed in a substrate;
   b. a recess formed in the substrate proximate the deep trench capacitor;
   c. a gate extending into but not completely occupying the recess;
   d. a source in the substrate beneath the recess;
   e. a drain in the substrate laterally and vertically offset from the source whereby a channel between the source and drain is created beneath the gate along a side wall of the recess; and
   f. a plug of polysilicon material in the recess adjacent the gate that reduces resistance between the source and the deep trench capacitor.

2. The DRAM cell structure of claim 1, wherein the recess is formed to a depth in the substrate greater than a depth of the drain.

3. The DRAM cell structure of claim 1, wherein a depth of the recess determines the length of the channel region and reduces dopant diffusion between the source and the drain.

4. The DRAM cell structure of claim 1, wherein the recess is formed to a depth so that the gate in a cell array area and the gate in a peripheral circuit area are at substantially the same level.

5. The DRAM cell structure of claim 1, wherein a junction of the source with the channel region and a junction of the drain with the channel region are not in the same plane.

6. The DRAM cell structure of claim 5, wherein the channel comprises silicon oxide along the side wall of the recess beneath the gate, on a portion of a horizontal surface above the recess connected to the side wall, and on a portion of a floor of the recess connected to the side wall.

7. The DRAM cell structure of claim 6, wherein the junction of the source with the channel region is at the portion of the floor of the recess and the junction of the drain with the channel region is at the portion of the horizontal surface above the recess.

8. The DRAM cell structure of claim 5, wherein the channel comprises silicon oxide along the side wall of the recess beneath the gate and on a portion of a floor of the recess connected to the side wall.

9. A dynamic random access memory (DRAM) cell structure, comprising:
   a. a deep trench capacitor formed in a substrate;
   b. a polysilicon layer overlying the deep trench capacitor
   c. a recess formed in the substrate proximate the deep trench capacitor;
   d. a gate formed at the recess but not completely occupying the recess to create a channel comprising a side wall of the recess, a portion of a horizontal surface above the recess connected to the side wall and a portion of a horizontal surface of a floor of the recess connected to the side wall;
   e. a source formed by doping the substrate in a region beneath the recess proximate the polysilicon layer;
   f. a drain in the substrate formed by doping the substrate in a region laterally and vertically offset from the source by the channel; and
   g. a plug of polysilicon material in the recess adjacent the gate that reduces resistance between the source and the deep trench capacitor.

10. The DRAM cell structure of claim 9, wherein the recess is formed to a depth in the substrate greater than a depth of the region in which the drain is formed.

11. The DRAM cell structure of claim 9, wherein a depth of the recess determines the length of the channel and reduces dopant diffusion between the source and the drain.

12. The DRAM cell structure of claim 9, wherein the recess is formed to a depth so as to make the channel sufficient long to facilitate scaling-down with semiconductor fabrication technologies without the need for relatively high channel doping concentration.

13. The DRAM cell structure of claim 9, and further comprising a bit line contact in the substrate that makes electrical contact with the drain, and wherein the gate makes electrical contact with a word line.

14. The DRAM cell structure of claim 9, wherein a junction of the source with the channel is at the portion of the floor of the recess and a junction of the drain with the channel is at the portion of the horizontal surface above the recess.

15. A dynamic random access memory (DRAM) cell structure, comprising:
   a. deep trench capacitance means formed in a substrate for storing a charge;
   b. recess means in an active area of the substrate proximate the deep trench capacitance means;
   c. source region means formed in the substrate beneath the recess means for transporting charge to and from the deep trench capacitance means;
   d. drain region means formed in the substrate laterally and vertically offset from the source region means;
   e. gate region means having silicon oxide on a side wall and a portion of a floor of the recess means for controlling charge transport across the channel between the source region means and drain region means; and
   f. means for plugging a space in the recess means not occupied by the gate region means for reducing resistance between the source region means and the deep trench capacitance means.

16. The DRAM cell structure of claim 15, wherein the recess means is formed to a depth in the substrate greater than a depth of the drain region means.

17. The DRAM cell structure of claim 15, and further comprising a channel between the source and the drain comprised of silicon oxide grown on a portion of a horizontal surface above the recess means connected to the side wall of the recess means, the side wall of the recess means, and a portion of the floor of the recess means connected to the side wall.

18. The DRAM cell structure of claim 17, wherein a junction of the source region means with the channel is at the portion of the floor of the recess means and a junction of the drain region means with the channel is at the portion of the horizontal surface above the recess means.

19. A dynamic random access memory (DRAM) cell structure, comprising:
   a. first and second deep trench capacitors formed in a substrate, each deep trench capacitor filled with polysilicon and having silicon oxide grown on its walls;
   b. a polysilicon layer overlying the first and second deep trench capacitors;
   c. an isolation layer of silicon oxide material formed in the substrate between a top portion of the first and second deep trench capacitors and extending over the polysilicon layer;
   d. a first recess formed in the substrate proximate the first deep trench capacitor on a first side of the isolation layer;
   e. a second recess formed in the substrate proximate the second deep trench capacitor on a second side of the isolation layer;
   f. a first gate formed at the first recess but not completely occupying the first recess having silicon oxide on a side wall of the first recess;
   g. a second gate formed at the second recess but not completely occupying the second recess having silicon oxide on a side wall of the second recess;
   h. a first source formed by doping the substrate in a region beneath the first recess;
   i. a first drain in the substrate formed by doping the substrate in a region laterally and vertically offset from the first source;
   j. a second source formed by doping the substrate in a region beneath the second recess;
   k. a second drain in the substrate formed by doping the substrate in a region laterally and vertically offset from the second source; and
   l. a plug of polysilicon material in each of the first and second recesses adjacent the first and second gates, respectively, wherein the plug reduces resistance between the corresponding source and deep trench capacitor.

20. The DRAM cell structure of claim 19, wherein the first and second recesses are formed to a depth in the substrate greater than a depth of the region in which the first and second drains, respectively, are formed.

21. The DRAM cell structure of claim 19, wherein a first channel between the first source and the first drain comprises silicon oxide on a portion of a horizontal surface above the first recess connected to the side wall of the first recess, and on a portion of a floor of the first recess connected to the side wall of the first recess, and wherein a second channel between the second source and second drain comprises silicon oxide on a portion of a horizontal surface above the second recess connected to the side wall of the second recess and on a portion of a floor of the second recess connected to the side wall of the second recess.

22. The DRAM cell structure of claim 19, and further comprising a first bit line contact that makes electrical contact with the first drain, a second bit line contact that makes electrical contact with the second drain, and wherein the first and second gates make electrical contact with a word line.

* * * * *